United States Patent
Lee

(10) Patent No.: US 6,178,120 B1
(45) Date of Patent: Jan. 23, 2001

(54) MEMORY STRUCTURE FOR SPEEDING UP DATA ACCESS

(75) Inventor: Hwan-Rei Lee, Hsinchu Hsien (TW)

(73) Assignee: Sunplus Technology Co., Ltd., Hsin-Chu (TW)

( * ) Notice: Under 35 U.S.C. 154(b), the term of this patent shall be extended for 0 days.

(21) Appl. No.: 09/431,218

(22) Filed: Nov. 1, 1999

(30) Foreign Application Priority Data

Jul. 28, 1999 (TW) .................................................. 88112831

(51) Int. Cl.⁷ .................................................. G11C 16/04
(52) U.S. Cl. .................................. 365/189.05; 365/189.07
(58) Field of Search ........................ 365/189.05, 189.07, 365/189.01

(56) References Cited

U.S. PATENT DOCUMENTS

| | | | |
|---|---|---|---|
| 4,894,770 | * 1/1990 | Ward et al. | 711/128 |
| 5,184,320 | * 2/1993 | Dye | 365/49 |
| 5,586,078 | * 12/1996 | Takase et al. | 365/230.03 |
| 5,644,747 | * 7/1997 | Kusuda | 711/5 |
| 5,887,272 | * 3/1999 | Sartore et al. | 711/105 |

* cited by examiner

Primary Examiner—David Nelms
Assistant Examiner—Hoai V. Ho
(74) Attorney, Agent, or Firm—Bacon & Thomas, PLLC

(57) ABSTRACT

A memory structure for speeding up data access is disclosed. The memory structure has a row decoder and a column decoder to decode the address in the address bus for addressing the memory cells. A plurality of data latch units, each having at least two latches, are provided to optionally latch the data of the memory cells addressed by the row decoder into one of the latches of each data latch unit. A compare and select logic unit determines whether the data of the memory cells addressed by the row addresses is stored in the plurality of data latch units. If not, one of the latches in each data latch unit is selected for latching the data of the memory cells addressed by the row address. Because data of multiple rows of memory cells can be stored in the data latch units, a high probability exists to have data and instruction code to be accessed stored in the data latch units whereby the speed of memory access is greatly increased.

10 Claims, 3 Drawing Sheets

MEMORY STRUCTURE FOR SPEEDING UP DATA ACCESS

BACKGROUND OF THE INVENTION

1. Field of the Invention

The present invention relates to a memory structure, and more particularly, to a memory structure that is able to increase the speed of data access.

2. Description of Related Art

With the progress of semiconductor technology, the capacity of memory has increased greatly and the operational speed of the central processing unit (CPU) has improved to be faster than the data accessing speed in a memory. Conventionally, to speed up the access time for the CPU to a memory, a cache memory is provided as a buffer between the CPU and a memory module. With reference to FIG. 4, a cache memory 43 is arranged between a CPU 41 and a memory 42 to improve the data access speed. The cache memory 43 is typically formed by static random access memories (SRAMs) whose access speed is much faster than that of the memory 42. Generally, the cache memory 43 is provided to store the data that has been recently accessed by the CPU 41. Therefore, if the CPU 41 intends to access data that has been accessed previously and is still stored in the cache memory 43 without being replaced, the cache memory 43 can send the data quickly to the CPU 41 without waiting for an extra cycle time. Accordingly, the speed to access data is improved. However, in such a manner to speed up data access time, the data to be accessed in the first time must be read from the memory 42. Only the memory access operation to the data that is accessed in the second time or latter can be speeded up. Moreover, the size of the cache memory 43 is usually relatively large, so that the hardware cost to have a memory structure with cache memory is high.

In addition, a well known page mode may also be provided to speed up data access to a memory. FIG. 5 shows the memory structure used to employ the page mode memory operation. It is illustrated that the address bus 51 to access the memory 50 is divided into column address bus 53 and row address bus 52. A column decoder 54 and a row decoder 55 are provided to decode the column address bus 53 and row address bus 52 to address the desired memory cells in the memory 50. The memory cells corresponding to the same row but different columns are referred to be of the same page mode. When the data to be read is in the memory cells of the same page with an identical row address, it is only necessary to decode the different column address bus 53 to access the data without decoding the row address bus 52. Therefore, the speed to access data can be improved. However, if the memory 50 stores both the computer instructions and data, the probability to access data of the same page is low because the CPU generally accesses data and instructions alternatively (for example, an instruction may be required to access data stored in memory). Furthermore, an interrupt may be asserted to the CPU so that the executing program will jump to another address. As a result, the CPU can rarely access data of the same page mode, and the data access speed can not be improved. Therefore, there is a need for the above memory access structure to be improved.

SUMMARY OF THE INVENTION

Accordingly, the object of the present invention is to provide a memory structure which utilizes a few data latches to speed up data access and, further, to reduce hardware cost and power consumption.

According to one aspect of the present invention, a memory structure is provided for speeding up data access. The memory structure stores data to be addressed by an address bus including a row address and column address. The memory structure has a memory unit having a plurality of memory cells for storing data therein. A row decoder is provided for decoding the row address to address the memory cells. A plurality of data latch units, each having at least two latches, are provided for optionally latching the data in the memory cells addressed by the row address into one of the latches of each data latch unit. A compare and select logic unit is provided for determining whether the data of the memory cells addressed by the row address is stored in the plurality of data latch units, and, if not, selecting one of the latches of each data latch unit to latch the data of the memory cells addressed by the row address. A column decoder is provided for decoding the column address to access data addressed by the address bus from the plurality of data latch units.

According to another aspect of the present invention, a memory structure for speeding up data access is provided. The memory structure has a memory unit having a plurality of memory cells for storing data therein. A row decoder is provided for decoding the row address to address the memory cells. A pre-column decoder is provided for decoding part of the column address to address the memory cells addressed by the row decoder. A plurality of data latch units, each having at least two latches, are provided for optionally latching the data in the memory cells addressed by the row decoder and the pre-column decoder into one of the latches of each data latch unit. A compare and select logic unit is provided for determining whether the data of the memory cells addressed by the row address and the part of the column address is stored in the plurality of data latch units, and, if not, selecting one of the latches of each data latch unit to latch the data of the memory cells addressed by the row address and the part of the column address. A post-column decoder is provided for decoding the remaining column address to access data addressed by the address bus from the plurality of data latch units.

The various objects and advantages of the present invention will be more readily understood from the following detailed description when read in conjunction with the appended drawing.

DETAILED DESCRIPTION OF THE PREFERRED EMBODIMENT

Figure 1:
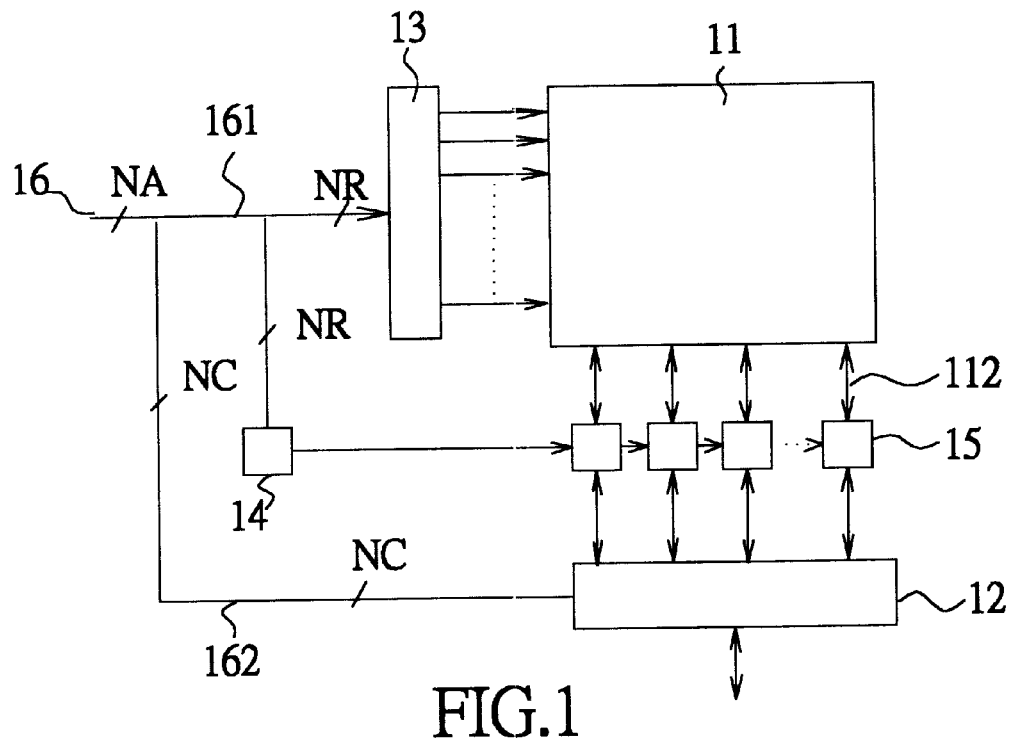
FIG. 1 is a functional block diagram showing a first preferred embodiment of the memory structure for speeding up the data access in accordance with the present invention.

With reference to FIG. 1, a preferred embodiment of a memory structure for speeding up data access in accordance with the present invention is shown. The memory structure inlcudes a memory unit 11, a column decoder 12, a row decoder 13, a compare and select logic unit 14, and a plurality of data latch units 15. The memory unit 11 is generally formed by a plurality of memory cells arranged in a matrix form. An address bus 16 of NA bits is provided to address the memory unit 11 to access specific memory cells.

The address bus 16 is divided into a row address bus 161 of NR bit, and a column address bus 162 of NC bits, wherein NA=NR+NC. The row address bus 161 is decoded by the row decoder 13. The decoding output of the row decoder 13 is provided to address the memory cells of the memory unit 11 for selecting the memory cells of a specific row so that data stored therein can be accessed from the data lines 112 of the memory unit 11.

Figure 2:
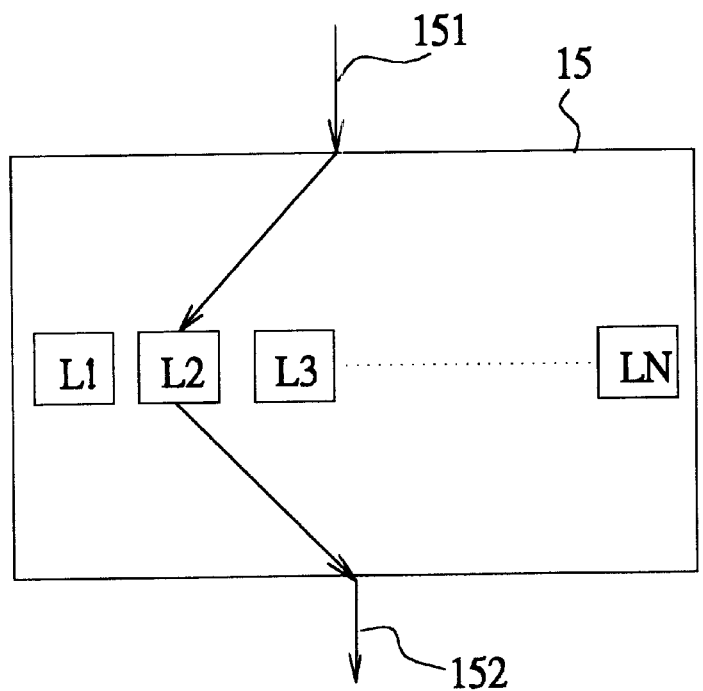
FIG. 2 shows the structure of the data latch unit illustrated in FIG. 1.

Each data line 112 of the memory unit 11 is connected to one of a plurality of data latch units 15, so that the data in the memory cells addressed by the row decoder 13 can be latched in the data latch units 15 if the data is not previously stored therein. The structure of each data latch unit 15 is shown in FIG. 2, which has N latches, denoted by $L_1 \sim L_N$, wherein $N \geq 2$. Each data latch unit 15 has an input 151 and an output 152, each switchably connecting to one of the N latches. The input 151 and output 152 are simultaneously switched to the same latch. Therefore, a group of latches, including every latch $L_i$ ($1 \leq i \leq N$) of each one of the data latch units 151, are provided to store the data in the memory cells of one row. Because each data latch unit 15 has N latches, data of the memory cells of N rows can be stored in the plurality of data latch units 15. In this preferred embodiment, the number of the memory cells in one row is $2^{NC}$. Therefore, the number of the data lines 112 of the memory unit 11 is $2^{NC}$. Accordingly, the number of the required data latch units 15 is also $2^{NC}$.

Based on the content of the row address bus 161, the compare and select logic unit 14 compares and determines whether the data in the memory cell addressed by the row address bus 161 is stored in the plurality of data latch units 15. If not, the input 151 and output 152 of each data latch unit 15 is switched to one of the latches for latching the data in the memory cell addressed by the row address bus 161. If yes, the row address bus 161 is not decoded and the input 151 and output 152 of each data latch unit 15 are switched to the latch stored with the addressed data. Furthermore, when the compare and select logic unit 14 selects the latch of the data latch unit 15 for storing the data of the memory cell, the latches without any data stored therein are selected first. When all the latches have stored data, the compare and select logic unit 14 selects a latch according to the arrangement order of the latches in the data latch unit 15, that is, from $L_1$ to $L_N$, to store data, while the original stored data is replaced.

The column decoder 12 is connected to the outputs 152 of the data latch units 15. The column address bus 162 is decoded by the column decoder to select one of the outputs 152 of the plurality of data latch units 15 for output, thereby accessing the data of the memory cell addressed by the address bus 16.

From the above description, it is known that in the memory structure for speeding up data access in accordance with the present invention, the data latch units 15 are employed before the decoding of the row decoder 12. Because each data latch unit 15 has N latches, data of N rows of memory cells can be stored in the data latch units 15. Therefore, when a program code and data are switchably accessed, there exists a high probability to have both of them stored in the data latch units 15. Accordingly, even though the data access mode is interleaving changed, the probability to access a same row (equivalent to the same page in page access mode) is high, whereby the speed of data access is greatly increased and the problem of slow first memory access, suffered in using the well known cache memory, can be eliminated. Moreover, because data to be accessed may already be latched, the data can be accessed without charging and discharging the circuit of the memory unit 11, so that power consumption can be greatly reduced.

Figure 3:
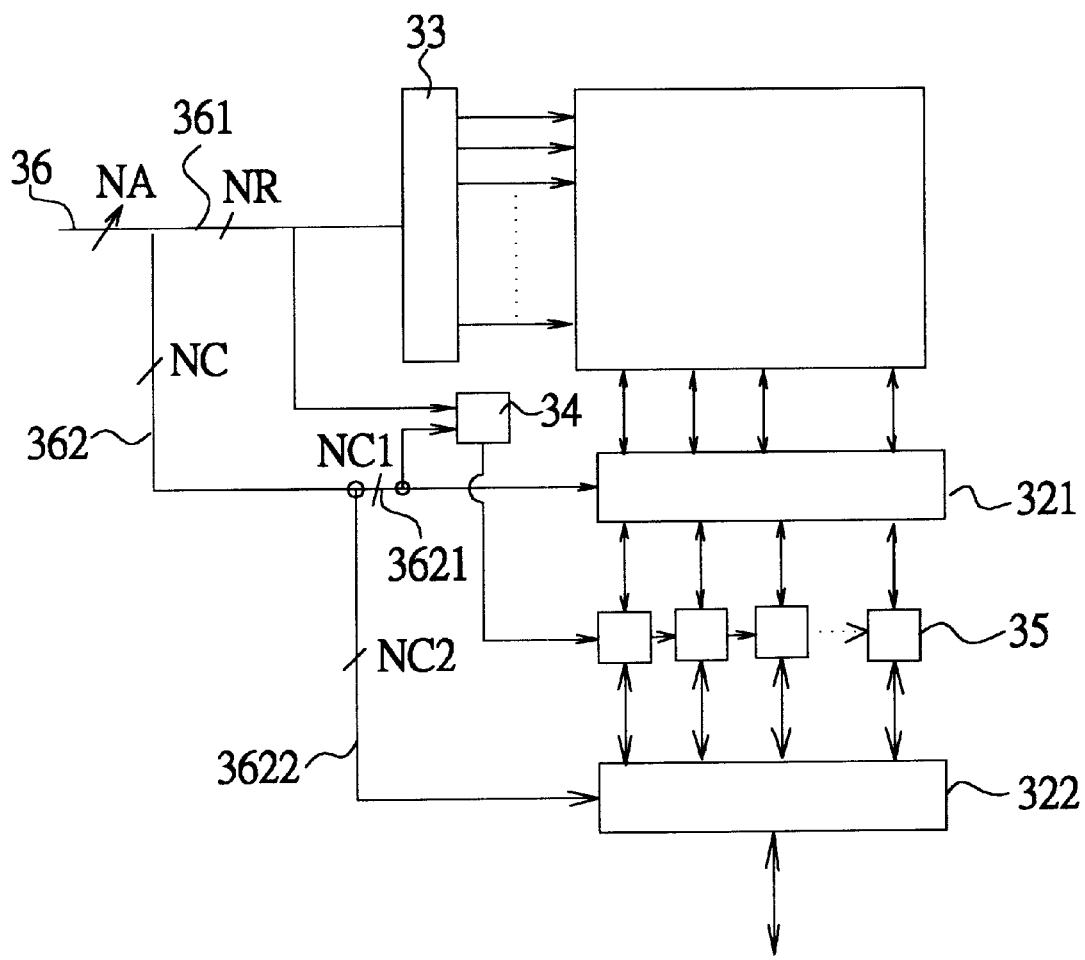
FIG. 3 is a functional block diagram showing a second preferred embodiment of the memory structure for speeding up data access in accordance with the present invention.
Figure 4:
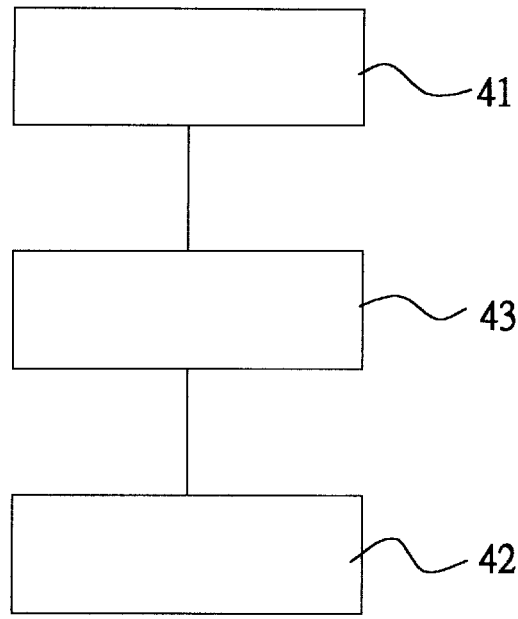
FIG. 4 shows a conventional memory structure having a cache memory.
Figure 5:
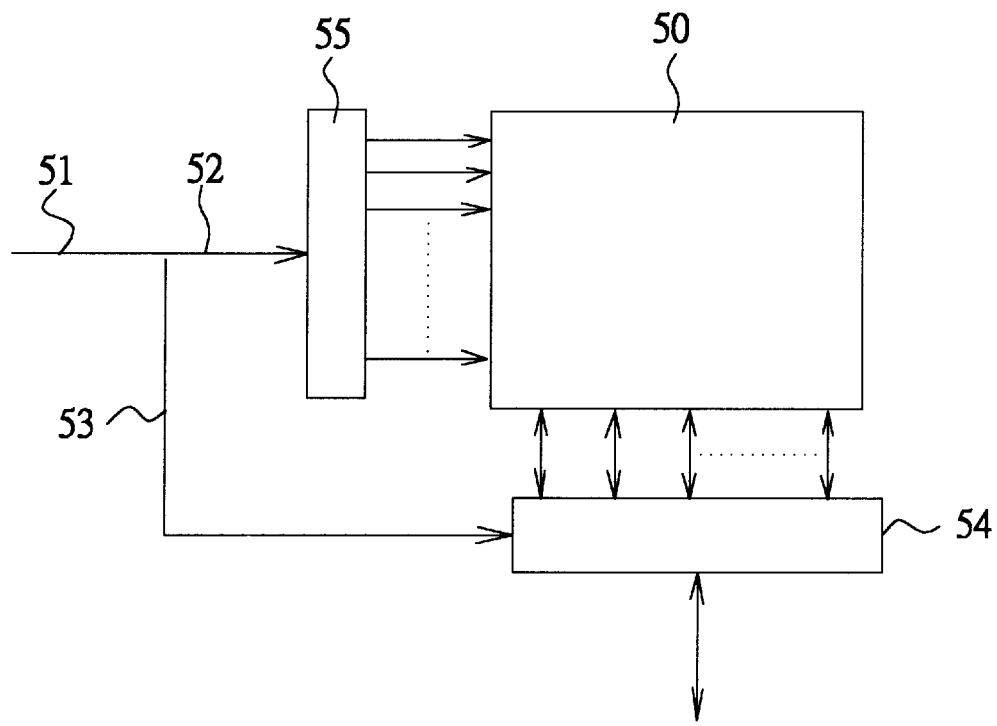
FIG. 5 shows a conventional memory structure employing a page mode.

Furthermore, in the layout of a memory circuit, the data lines are generally very dense (in this embodiment, the number of data lines is $2^{NC}$). Therefore, if each data line is connected to a data latch unit 15, the number of data latch units 15 is large, resulting in the layout space and hardware cost being increased. Therefore, in another preferred embodiment shown in FIG. 3, a pre-row decoder 321 is provided to decode a part of column address bus 3621 of NC1 bits in the column address bus 362 of NC bits for addressing the memory cells addressed by the row decoder 33. After such a partial decoding, based on the comparison operation of the compare and select logic (34) to the contents of the row address bus 361 and the part of column address bus 3621, the data of the memory cells addressed by the row decoder 33 and the pre-column decoder 321 is optionally latched into one latch of every data latch unit 35 via the outputs of the pre-column decoder 321. The operation manner is similar to that of the first preferred embodiment. Finally, a post-column decoder 322 is provided to decode the remained column address bus 3622 of NC2 bits in the address bus 36 so as to obtain the data of the memory cells addressed by the address bus 36 from a plurality of data latch units 355. In the structure of this preferred embodiment, since the column address bus 362 is partially decoded in advance, therefore, the number of the data latch units 35 is only $2^{NC2}$ (NC2=NC−NC1 ). As a result, the hardware cost and layout space can be greatly reduced.

In this preferred embodiment, by taking a memory unit of 256 K as an example, the memory cells of the memory unit can be divided into 512 rows and 512 columns. The address bus 36 is of 18 bits, which includes the 9-bit column address bus 361 and the 9-bit row address bus 362 (i.e. NA=18, NR=9, NC=9). If the number of latches in each data latch unit 35 is two (i. e. N=2) and five bits of the column address bus 361 are partially decoded (i. e. NC1=5, NC2=NC−NC1= 4), the number of data latch units 35 required is $2^4$=16. The total latches required is thus only N×16=32. From the point of view of efficiency, the access time for a typical memory unit is 11 ns while the access time for a latch is only 5 ns. When the probability that the data or instruction code to be accessed is in latches is 15/16, the required average access time is 100×1/16+5×15/16=10.93 ns. Therefore, comparing to the original memory access time of 100 ns, the speed has been improved by 9.2 times.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A memory structure for speeding up data access, said memory structure storing data to be addressed by an address bus including a row address supplied by a row address bus and a column address supplied by a column address bus, said memory structure comprising:

a memory unit having a plurality of memory cells for storing data therein;

a row decoder for decoding said row address to address said memory cells;

a plurality of data latch units, each having at least two latches, for optionally latching the data in said memory cells addressed by said row address into one of said latches of each data latch unit;

a logic unit for determining, based on previous addresses supplied by said row address bus, whether the data of said memory cells addressed by said row address is stored in said plurality of data latch units, and, if the data of said memory cells addressed by said row address is not stored in said plurality of data latch units, selecting one of said latches of each data latch unit to latch the data of said memory cells addressed by said row address; and a column decoder for decoding said column address to access data addressed by said address bus from said plurality of data latch units.

2. The memory structure for speeding up data access as claimed in claim 1, wherein said column address has NC bits, and the number of said data latch units is $2^{NC}$.

3. The memory structure for speeding up data access as claimed in claim 1, wherein said compare and select logic unit first selects the latches of said data latch units without data stored therein to store the data of said memory cells addressed by said row address.

4. The memory structure for speeding up data access as claimed in claim 3, wherein said compare and select logic unit selects the latches of said data latch units to store the data of said memory cells addressed by said row address according to an arrangement order of said latches in each of said data latch units.

5. The memory structure for speeding up data access as claimed in claim 3, wherein, if selected latches of said data latch units have data stored therein, said stored data is replaced by the data of said memory cells addressed by said row address.

6. A memory structure for speeding up data access, said memory structure storing data to be addressed by an address bus including row address and column address, said memory structure comprising:

a memory unit having a plurality of memory cells for storing data therein;

a row decoder for decoding said row address to address said memory cells;

a pre-column decoder for decoding part of said column address to address the memory cells addressed by said row decoder;

a plurality of data latch units, each having at least two latches, for optionally latching the data in said memory cells addressed by said row decoder and said pre-column decoder into one of said latches of each data latch unit;

a compare and select logic unit for determining whether the data of said memory cells addressed by said row address and said part of column address is stored in the plurality of data latch units, and, if not, selecting one of said latches of each data latch unit to latch the data of said memory cells addressed by said row address and said part of column address; and a post-column decoder for decoding the remaining column address to access data addressed by said address bus from said plurality of data latch units.

7. The memory structure for speeding up data access as claimed in claim 6, wherein said column address has NC bits, said part of column address decoded by said pre-column decoder has NC1 bits, and the number of said data latch units is $2^{NC2}$, where NC2=NC−NC1.

8. The memory structure for speeding up data access as claimed in claim 7, wherein said compare and select logic unit first selects the latches of said data latch units without data stored therein to store the data of said memory cells addressed by said row address and said part of column address.

9. The memory structure for speeding up data access as claimed in claim 8, wherein said compare and select logic unit selects the latches of said data latch units to store the data of said memory cells addressed by said row address and said part of column address according to an arrangement order of said latches in each of said data latch units.

10. The memory structure for speeding up data access as claimed in claim 9, wherein, if selected latches of said data latch units have data stored therein, said stored data is replaced by the data of said memory cells addressed by said row address and said part of column address.

* * * * *